United States Patent [19]

Huber et al.

[11] Patent Number: 5,567,199

[45] Date of Patent: Oct. 22, 1996

[54] WORKPIECE HOLDER FOR ROTARY GRINDING MACHINES FOR GRINDING SEMICONDUCTOR WAFERS, AND METHOD OF POSITIONING THE WORKPIECE HOLDER

[75] Inventors: Anton Huber, Burghausen; Robert Weiss, Winhöring, both of Germany

[73] Assignee: Wacker-Chemitronic Gesellschaft für Elektronik-Grundstoffe AG, Burghausen, Germany

[21] Appl. No.: 310,048

[22] Filed: Sep. 21, 1994

[30]  Foreign Application Priority Data

Oct. 21, 1993 [DE] Germany .................. 43 35 980.9

[51] Int. Cl.⁶ ............................................. B24B 5/00
[52] U.S. Cl. .................... 451/398; 451/287; 451/285; 451/388; 451/405
[58] Field of Search .................... 451/278, 285, 451/290, 10, 11, 387, 41, 12, 13, 14, 15, 405, 411, 388, 165, 398, 287; 457/411, 414, 397, 402, 405

[56]    References Cited

U.S. PATENT DOCUMENTS

| 3,872,626 | 3/1975 | White | 451/285 |
|---|---|---|---|
| 4,597,228 | 7/1986 | Koyama et al. | 451/388 |
| 4,603,867 | 8/1986 | Babb et al. | 451/388 |
| 5,054,244 | 10/1991 | Takamatsu et al. | 451/411 |
| 5,069,002 | 12/1991 | Sandhu et al. | 451/165 |
| 5,113,622 | 5/1992 | Nishiguchi et al. | 451/285 |
| 5,117,589 | 6/1992 | Bischoff et al. | 451/405 |
| 5,297,361 | 3/1994 | Baldy et al. | 451/414 |
| 5,320,007 | 6/1994 | Weirauch | 451/405 |

FOREIGN PATENT DOCUMENTS

| 0092818 | 7/1986 | European Pat. Off. . |
|---|---|---|
| 0388972 | 9/1990 | European Pat. Off. . |
| 3524690 | 3/1986 | Germany . |
| 4136882 | 5/1993 | Germany . |
| 4025365 | 1/1992 | Japan ............. 451/411 |

OTHER PUBLICATIONS

Derwent Abstract pertaining to DE 41 36 882.
Derwent Abstract pertaining to DE 35 24 690.

*Primary Examiner*—D. S. Meislin
*Assistant Examiner*—George Nguyen
*Attorney, Agent, or Firm*—Collard and Roe, P.C.

[57]  ABSTRACT

A workpiece holder for rotary grinding machines for grinding semiconductor wafers has a rotatable work surface which points toward a rotating grinding tool and on which the semiconductor wafer to be machined is laid, and has piezoelectric elements on which the workpiece holder is axially supported. The piezoelectric elements can be operated independently of one another and, when operated, undergo a change in their linear dimension, an operated piezoelectric element axially raising or lowering the workpiece holder at the point at which it supports the workpiece holder. There is also a method for positioning the workpiece holder.

9 Claims, 1 Drawing Sheet

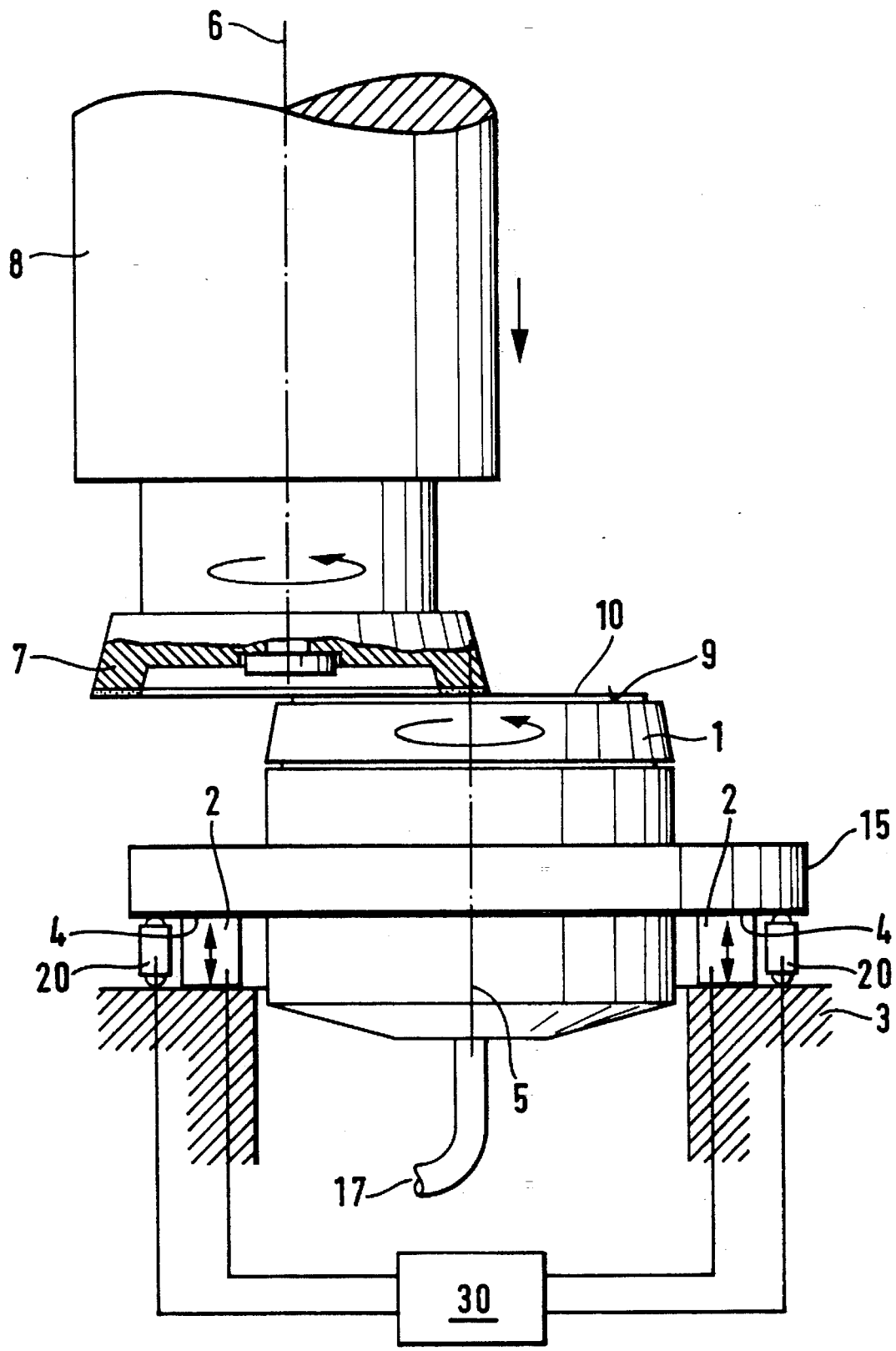

5,567,199

WORKPIECE HOLDER FOR ROTARY GRINDING MACHINES FOR GRINDING SEMICONDUCTOR WAFERS, AND METHOD OF POSITIONING THE WORKPIECE HOLDER

BACKGROUND OF THE INVENTION

1. Field of the Invention

The present invention relates to a workpiece holder for rotary grinding machines for grinding semiconductor wafers, having a rotatable work surface which points toward the rotating grinding tool and on which the semiconductor wafer to be machined is laid, and having means on which the workpiece holder is supported axially. In addition, the invention relates to a method of positioning the workpiece holder.

2. The Prior Art

In the grinding of the surfaces of the semiconductor wafers, considerable importance is given to the relative spatial positions of the axis of rotation of the workpiece holder and the axis of rotation of the grinding tool of the rotary grinding machine. It may, for example, be expedient to hold the axis of rotation of the grinding tool and the axis of rotation of the workpiece holder inclined toward or against one another so as to enclose a defined angle, in order to give a special geometry, for example, a curved side face, to the semiconductor wafer through the grinding.

The usual aim is to remove by the grinding process a layer of uniform thickness from one of the side faces of the semiconductor wafer which is to be machined. The prerequisite for achieving this aim is that the work surface of the workpiece holder and the grinding plane of the grinding tool lie parallel to one another. In order to meet this condition, the axis of rotation of the workpiece holder and the axis of rotation of the grinding tool must have parallel orientations.

During the grinding of a semiconductor wafer, the positions of the axes can change because of temperature influences and prevailing process forces. Means must therefore be provided for restoring the desired relative positions of the two axes.

This was done hitherto by purposeful variation of the orientation of the axis of rotation of the grinding tool by turning the spindle of the grinding tool about a defined center of rotation, or deforming its suspension. The orientation of the axis of rotation of the rigidly mounted workpiece holder is not changed in this case. This procedure is complicated and time-consuming and, in view of the ever stricter demands on the geometry of the ground semiconductor wafers, leads to insufficiently accurate results.

SUMMARY OF THE INVENTION

It is an object of the present invention to provide an apparatus and a method with which the relative spatial positions of the axis of rotation of the grinding tool and the axis of rotation of the workpiece holder can be given a defined adjustment in a simple manner and with great accuracy.

This object is achieved with a workpiece holder for rotary grinding machines for grinding semiconductor wafers, having a rotatable work surface which points toward the rotating grinding tool and on which the semiconductor wafer to be machined is laid, and having means on which the workpiece holder is axially supported, wherein the means are piezoelectric elements which can be operated independently of one another and, when operated, undergo a change in their linear dimension, an operated piezoelectric element axially raising or lowering the workpiece holder at the point at which it supports the workpiece holder.

The object is additionally achieved by a method of positioning the workpiece holder according to the invention, wherein the piezoelectric elements are operated in such a manner that the axis of rotation of the workpiece holder and the axis of rotation of the grinding tool are oriented parallel or assume a defined position relative to one another.

"Piezoelectric element" is understood to refer to piezoelectric translators which are known per se, which are commercially available and which convert electrical energy into kinetic energy. The principle underlying the invention is that of integrating piezoelectric elements into the workpiece holder of rotary grinding machines for semiconductor wafers and of using their movement to position the workpiece holder.

BRIEF DESCRIPTION OF THE DRAWINGS

Other objects and features of the present invention will become apparent from the following detailed description considered in connection with the accompanying drawing which discloses an embodiment of the present invention. It should be understood, however, that the drawing is designed for the purpose of illustration only and not as a definition of the limits of the invention.

The figure shows schematically and by way of example a cross section through a rotary grinding machine for grinding semiconductor wafers.

DETAILED DESCRIPTION OF PREFERRED EMBODIMENTS

Turning now in detail to the drawing, the workpiece holder 1 according to the invention (also known as a chuck) has, as a preferred embodiment, three piezoelectric elements 2, which are preferably anchored to the machine frame 3. The piezoelectric elements axially support the workpiece holder. They are so arranged that, when operated, that is to say when the electric voltage applied is changed, they undergo a variation of their axial linear dimension. Depending on the variation of the voltage, the workpiece holder is axially raised or lowered at the point where it is supported by a piezoelectric element. The support points 4, at which the workpiece holder is axially supported by the piezoelectric elements, are preferably points which lie on the periphery 15 of the workpiece holder, because the torque that can be exerted by the piezoelectric elements arranged peripherally is greater than when the support points are arranged closer to the axis of rotation 5 of the workpiece holder. This latter arrangement of the support points may, however, be preferable when the desired relative spatial positions of the axis of rotation of the workpiece holder and of the axis of rotation of the grinding tool cannot be adjusted with peripherally arranged support points.

The workpiece holder is preferably equipped with a suction device 17, which enables one of the side faces of a semiconductor wafer, which is to be machined, to be drawn by suction against the work surface of the workpiece holder.

Each piezoelectric element is allocated its own measuring probe 20 for recording the instantaneous linear dimension of the piezoelectric element. The piezoelectric elements are operated in accordance with the relative spatial positions of the axis of rotation 5 of the workpiece holder 1 and of the axis of rotation 6 of the grinding tool 7 which are to be adjusted. For the operation of the piezoelectric elements, a central control unit 30 is provided, by which each piezoelectric element can be operated independently of the others.

The workpiece holder supported on the piezoelectric elements can be positioned with great precision. If all the piezoelectric elements are operated simultaneously and their linear dimensions are changed by a certain value in the same direction, the workpiece holder executes a feed movement without variation of the orientation of the axis of rotation 5. This type of feed is to be preferred to a feed through an axial movement of the tool spindle 8, in particular when only very close tolerances are permissible for the required removal of material by grinding and the feed must take place as uniformly and continuously as possible. It is therefore desirable to start the grinding of a semiconductor wafer at first with a feed controlled by the movement of the tool spindle, and then to change over to a feed controlled by the movement of the workpiece holder as soon as the grinding tool is within the range of the maximum stroke of the piezoelectric elements.

The workpiece holder can also be so positioned that the spatial orientation of its axis of rotation, and therefore also the position of said axis relative to the axis of rotation of the grinding tool, are changed. This is done by operating one or more of the piezoelectric elements, the above-mentioned symmetrical, that is to say simultaneous, operation of all the piezoelectric elements, with variation of their linear dimensions in the same direction, being excluded. By non-symmetrical operation of the piezoelectric elements the work surface 9 of the workpiece holder 1 and the semiconductor 10 lying on it are tilted out of their original positions.

A defined spatial orientation of the axis of rotation of the workpiece holder is consequently assigned to each actual value of the linear dimension of the piezoelectric elements. If it is necessary to change this orientation, for example, after it has been found when checking the geometry of a ground semiconductor wafer that the relative spatial positions of the axis of rotation of the workpiece holder and the axis of rotation of the grinding tool have changed during the grinding of the semiconductor wafer, the original relative spatial positions of the two axes can be restored by appropriate operation of the piezoelectric elements. Depending on the targeted action, the piezoelectric elements are operated such that the axis of rotation of the workpiece holder, and the axis of rotation of the grinding tool, are oriented parallel or assume a defined position relative to one another. The workpiece holder is expediently positioned in the desired way with the aid of the central control unit, by means of which all the piezoelectric elements can be operated individually or conjointly.

In principle, up to two of the three piezoelectric elements can be replaced with support elements. In such cases, however, the freedom of movement of the workpiece holder is restricted to a greater or lesser extent and the feeding of the workpiece holder is not possible.

The above-described method for positioning the workpiece holder in rotary grinding machines for semiconductor wafers has the particular advantage that the correction of the spatial orientation of the axis of rotation of the workpiece holder can be effected very quickly and without particular expense. The accuracy of the adjustment of the axis is so great that semiconductor wafers can be ground with improved precision. The invention is therefore preferentially used for grinding silicon wafers and so-called bonded SOI (silicon on insulator) wafers.

Another advantage is that the axial cutting power of the grinding tool can be measured by means of the voltage applied to the piezoelectric element. An unforeseen variation of the cutting power during the grinding of a semiconductor wafer may be a sign that the relative spatial positions of the axis of rotation of the grinding tool and of the axis of rotation of the workpiece holder have been unintentionally changed. It may, however, also mean that some other parameter substantially influencing the grinding operation has changed. It is therefore expedient to monitor, with the aid of the piezoelectric elements, the cutting power effective during the grinding of a semiconductor wafer, and to interrupt the grinding operation and check the rotary grinding machine if anomalies occur.

The present invention will be further illustrated by reference to the following example, which is not to be deemed limitative of the present invention in any manner thereof.

EXAMPLE

In a trial, the workpiece holder of a rotary grinding machine of the Disco DFG-82IF/8 type was supported axially on the machine frame, in the manner shown in the figure, by three piezoelectric elements made by Physik Instrumente. The maximum stroke of the piezoelectric elements was 10 μm. A measuring probe was allocated to each piezoelectric element in order to determine the linear dimension of the piezoelectric element. The piezoelectric elements were able to be operated from a central control unit. With these structural features in the machine, semiconductor wafers were ground with the target requirement that they should be as even as possible after grinding. Through the use of the method according to the invention, it was possible to keep the total thickness variation of each semiconductor wafer (TTV value), as a measure of its evenness, below the value of 1 μm.

While several embodiments of the present invention have been shown and described, it is to be understood that many changes and modifications may be made thereunto without departing from the spirit and scope of the invention as defined in the appended claims.

What is claimed is:

1. A workpiece holder for a rotary grinding machine having a rotating grinding tool for grinding semiconductor wafers, said workpiece holder having a periphery and comprising a rotatable work surface which points toward the rotating grinding tool and on said surface the semiconductor wafer to be machined is laid;

piezoelectric elements on which the workpiece holder is axially supported at its periphery and which can be operated independently of one another and, when operated, undergo a change in their linear dimension, an operated piezoelectric element axially raising or lowering the workpiece holder at the point at which it supports the workpiece holder;

a measuring probe for each piezoelectric element recording its linear dimension; and a central control unit for operating the piezoelectric elements.

2. The workpiece holder as claimed in claim 1, wherein there are three piezoelectric elements which are provided for the axial support of the workpiece holder.

3. The workpiece holder as claimed in claim 1, further comprising suction means by which the semiconductor wafer to be machined is drawn against the rotatable work surface of the workpiece holder.

4. A method of positioning a workpiece holder for a rotary grinding machine for grinding semiconductor wafers, having a rotatable work surface which points toward a rotating grinding tool and on which the semiconductor wafer to be machined is laid, and having piezoelectric elements on which the workpiece holder is axially supported at its periphery, each piezoelectric element being equipped with a measuring probe recording its linear dimension, wherein the piezoelectric elements can be operated independently of one another by a central control unit and, when operated, undergo a change in their linear dimension, an operated piezoelectric element axially raising or lowering the workpiece holder at the point at which it supports the workpiece holder;

said method comprising operating said piezoelectric elements in such a manner that an axis of rotation of the workpiece holder and an axis of rotation of the grinding tool are oriented parallel or assume a defined position relative to one another.

5. The method as claimed in claim 4, further comprising operating the piezoelectric elements in such a manner that the workpiece holder executes a feed movement.

6. The method as claimed in claim 4, further comprising during the grinding of a semiconductor wafer, measuring the axial cutting power of the rotary grinding machine with the aid of the piezoelectric elements; and repositioning said workpiece holder after an unforeseen variation of the cutting power.

7. In a method for grinding a semiconductor wafer, the improvement which comprises providing a workpiece holder for a rotary grinding machine having a rotating grinding tool for grinding semiconductor wafers, said workpiece holder having a periphery;

placing a semiconductor wafer on a rotatable work surface which points toward the rotating grinding tool and on said surface the semiconductor wafer to be machined is laid;

placing piezoelectric elements on which the workpiece holder is axially supported at its periphery and which can be operated independently of one another and, when operated, undergo a change in their linear dimension, an operated piezoelectric element axially raising or lowering the workpiece holder at the point at which it supports the workpiece holder;

providing a measuring probe for each piezoelectric element recording its linear dimension; and operating the piezoelectric elements with a central control unit.

8. The method as claimed in claim 4 wherein said semiconductor wafer is a silicon wafer.

9. The method as claimed in claim 4, wherein said semiconductor wafer is a silicon on insulator wafer.

* * * * *